United States Patent [19]

Sim

[11] Patent Number: 5,567,989
[45] Date of Patent: Oct. 22, 1996

[54] HIGHLY INTEGRATED SEMICONDUCTOR WIRING STRUCTURE

[75] Inventor: Sang-pil Sim, Kyungki-do, Rep. of Korea

[73] Assignee: Samsung Electronics Co., Ltd., Suwon, Rep. of Korea

[21] Appl. No.: 280,887

[22] Filed: Jul. 27, 1994

[30] Foreign Application Priority Data

Jul. 27, 1993 [KR] Rep. of Korea ................ 1993-14293

[51] Int. Cl.$^6$ ................................................ H01L 23/48
[52] U.S. Cl. .................... 257/774; 257/775; 257/776
[58] Field of Search ..................... 257/774, 775, 257/776

[56] References Cited

U.S. PATENT DOCUMENTS 5,432,381 7/1995 Melzner ........................... 257/774

FOREIGN PATENT DOCUMENTS 58-201344 11/1983 Japan ................................. 257/775
60-176251 9/1985 Japan ................................. 257/775

*Primary Examiner*—William Mintel
*Assistant Examiner*—Roy Potter
*Attorney, Agent, or Firm*—Cushman Darby & Cushman, L.L.P.

[57] ABSTRACT

In a highly integrated semiconductor wiring structure having a plurality of wiring layers and a self-aligned contact hole formed therebetween, the wiring layer is formed such that a portion where a contact hole will be formed is formed to a first wiring width and a remaining portion is formed to a second wiring width being wider than the first wiring width. In the method for manufacturing such a structure, the contact hole is formed in self-alignment fashion, and thus, a short which may occur due to misalignment can be prevented.

7 Claims, 7 Drawing Sheets

5,567,989

HIGHLY INTEGRATED SEMICONDUCTOR WIRING STRUCTURE

BACKGROUND OF THE INVENTION

The present invention relates to a highly integrated semiconductor device wiring structure and a method for manufacturing the same, and more particularly, to a highly integrated semiconductor device wiring structure using a self-aligned contact hole and a method for manufacturing the same.

As a semiconductor integrated circuit becomes highly integrated, a misalignment margin between a plurality of wiring layers or contact holes gradually diminishes. More particularly, in cases where the controlling design rule is limiting and complex patterns are repeated such as a memory cell, a method wherein a contact hole is formed by a self-alignment technique so as to reduce cell area is developed.

The conventional method for forming a self-aligned contact hole is one in which the contact hole is formed using the step differential of a peripheral structure. Since contact holes of various sizes are obtained without using a mask according to peripheral structure height, insulating material thickness at the point where the contact hole is formed, and the etching method, the above method is suitable for obtaining a highly integrated semiconductor device.

A layout view of a conventional semiconductor memory device using the above-described self-aligned contact hole is shown in FIG. 1. Here, reference numeral 200 indicates a gate electrode, 300 and 350 indicate first and second pad electrodes, respectively, numeral 360 indicates a bit-line contact hole, numeral 400 indicates a bit-line electrode, and numeral 450 indicates a storage-node contact hole.

FIGS. 2 and 3 are cross-sectional views of a semiconductor memory device manufactured according to the conventional method, taken along lines AA' and BB' in FIG. 1, respectively.

Referring to FIGS. 2 and 3, after defining an active region 102 by forming an isolation region 104 on a semiconductor substrate 100, gate electrodes 200 of an access transistor, which extend in one direction, are formed on substrate 100 with a gate oxide film (not shown) disposed therebetween. Then, after forming a first insulating film 220 over gate electrodes 220, first insulating film 220 is anisotropically etched. Thereafter, impurity ions are implanted to obtain first and second impurity regions 150 and 160 in substrate 100, which are separated from one another by gate electrode 200. At this time, a contact hole (not shown), which exposes a predetermined portion of active region 102, is formed in self-alignment with respect to first insulating film 220 during the just-mentioned anisotropic etching of first insulating film 220. Then, a conductive material is deposited on the resultant structure and is patterned by a lithography process, thereby forming first and second pad electrodes 300 and 350 which are connected with first and second impurity regions 150 and 160, respectively. Thereafter, a second insulating film 320 is formed and etched to obtain a bit-line contact hole 360 over second pad electrode 350 (see FIG. 1). Then, a conductive material is deposited and patterned by a lithography process to form bit-line electrodes 400 which are connected with second pad electrode 350 through bit-line contact hole 360. After forming a third insulating film 420 on second insulating film 320, third and second insulating films 420 and 320 are etched to thereby form storage-node contact holes 450 over first pad electrodes 300. Thereafter, storage nodes 500 which are connected with first pad electrodes 300 through storage-node contact holes 450, dielectric film 550, and plate node 600 are sequentially formed.

According to the above-described conventional method, storage nodes 500 and bit-line electrodes 400 are respectively connected with first and second impurity regions 150 and 160 of the access transistor, using first and second pad electrodes 300 and 350. Therefore, misalignment in the AA' direction of FIG. 1 during the process of forming bit-line contact hole 360 and storage-node contact holes 450 can cause a short between gate electrode 200 and bit-line electrode 400 or storage node 500. After storage-node contact holes 450 are formed, a short between storage node 500 and bit-line electrode 400 may occur due to misalignment with respect to bit line electrode 400, thus deteriorating reliability in the semiconductor memory device.

SUMMARY OF THE INVENTION

Accordingly, it is an object of the present invention to provide a reliable, highly integrated semiconductor wiring structure using a self-aligned contact hole.

It is another object of the present invention to provide a method for manufacturing a highly integrated semiconductor wiring structure especially suitable for manufacturing the above-mentioned contact hole.

To accomplish the above object, a semiconductor device wiring structure is provided having a plurality of wiring layers and a contact hole formed between respective wiring layers. The wiring layers are formed so that a region between respective wires where a contact hole is formed has a first width extending between the wiring layers, and a remaining interval between the wiring layers has a second width being narrower than the first width.

In addition, a method is provided for manufacturing a highly integrated semiconductor device wiring structure having a plurality of wiring layers and a contact hole formed between respective wiring layers, comprising the steps of:

forming first wiring layers on a semiconductor substrate such that a region between respective first wiring layers where a contact hole is to be formed has a first width extending between the wiring layers and a remaining portion therebetween has a second width being narrower than the first width;

forming an insulating film on the substrate on which the first wiring layers are formed;

etching the insulating film to thereby form a contact hole between respective first wiring layers, at the region having the first width therebetween; and forming a second wiring layer on the insulating film having the contact hole formed therein.

According to the present invention, a contact hole is thus formed between neighboring wiring layers without a lithography process so as to self-align with respect to the wiring layer.

BRIEF DESCRIPTION OF THE DRAWINGS

The above objects and advantages of the present invention will become more apparent by describing in detail a preferred embodiment thereof with reference to the attached drawings in which:

FIGS. 8A, 9A and 10 are taken along line BB ' and FIGS. 8B and 9B are taken along line CC' in FIG. 7.

DETAILED DESCRIPTION OF THE INVENTION

The present invention will be explained in more detail with reference to the attached drawings.

FIGS. 4A & 4B, FIGS. 5A, 5B & 5C and FIGS. 6A & 6B are layout diagrams and cross-sectional views for illustrating a highly integrated semiconductor wiring structure according to the present invention. Certain details are omitted in one of a corresponding pair of layout and cross-sectional views for clarity.

Figure 1:
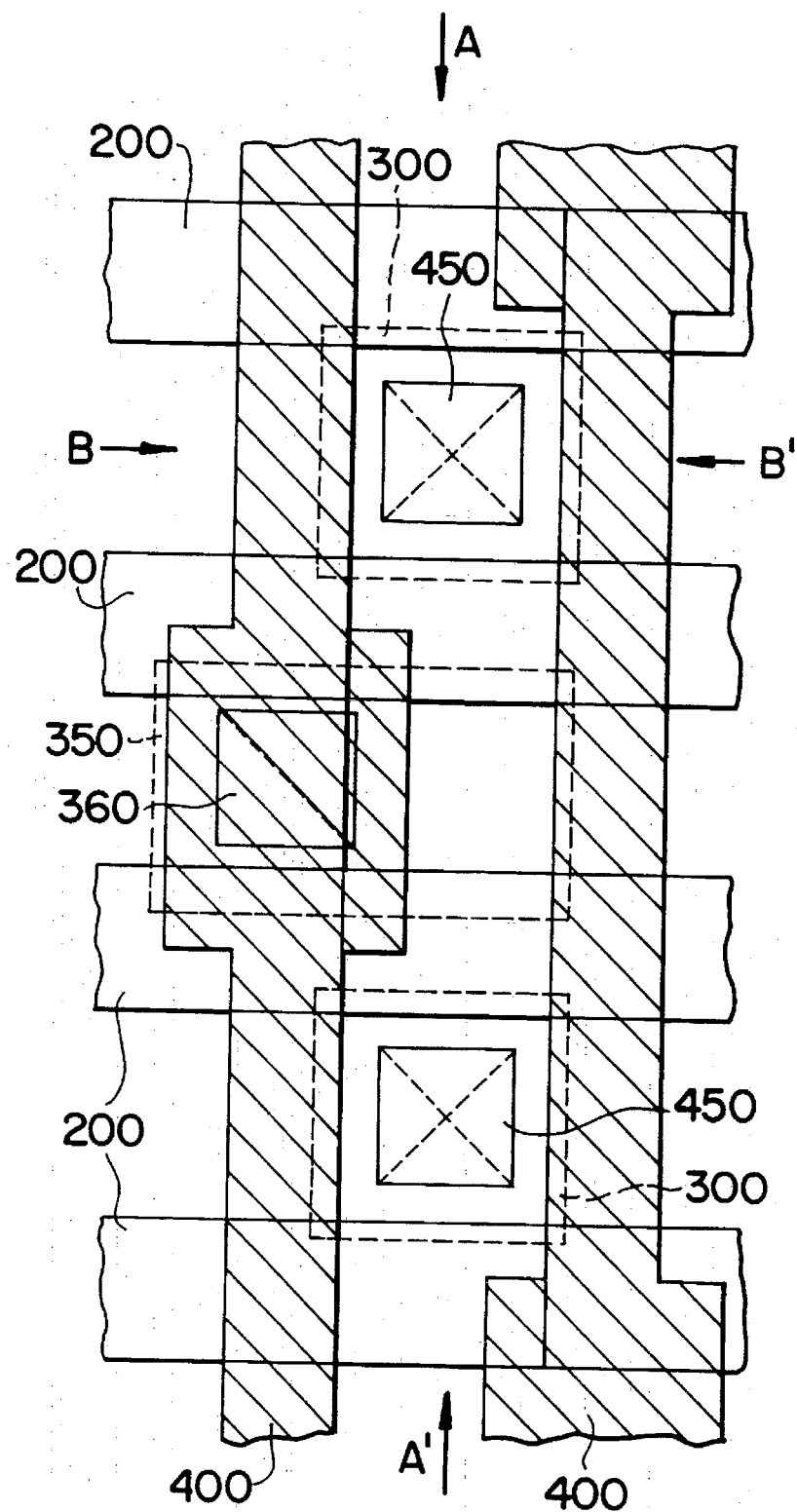
FIG. 1 is a layout diagram showing a semiconductor memory device according to a conventional method.
Figure 2:
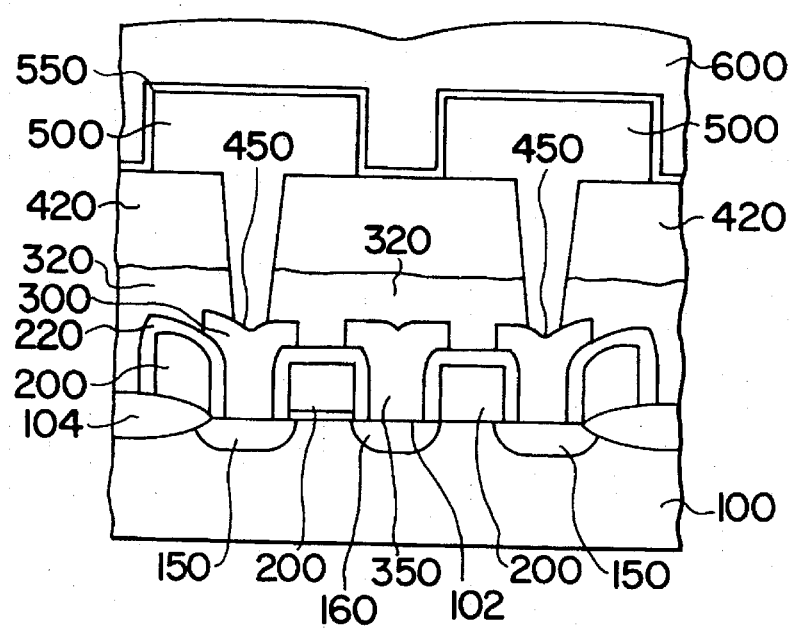
FIGS. 2 and 3 are cross-sectional views of a semiconductor memory device manufactured according to a conventional method, taken along line AA' and BB' in FIG. 1, respectively.
Figure 3:
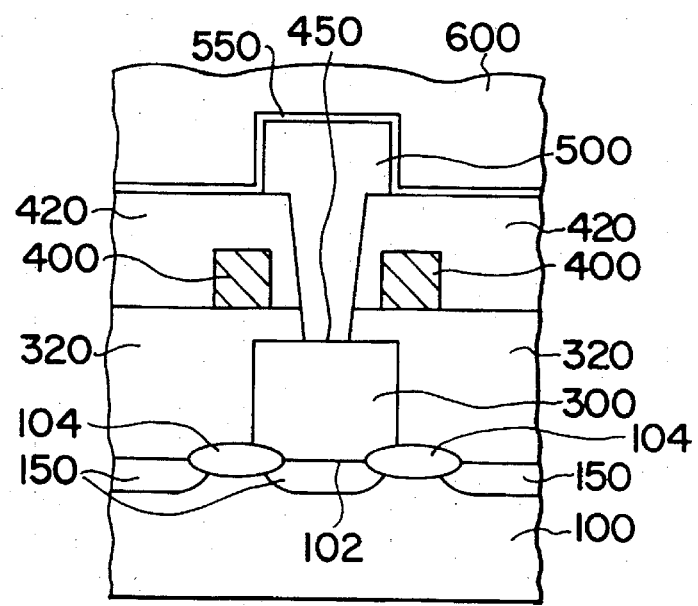
Figure 4A:
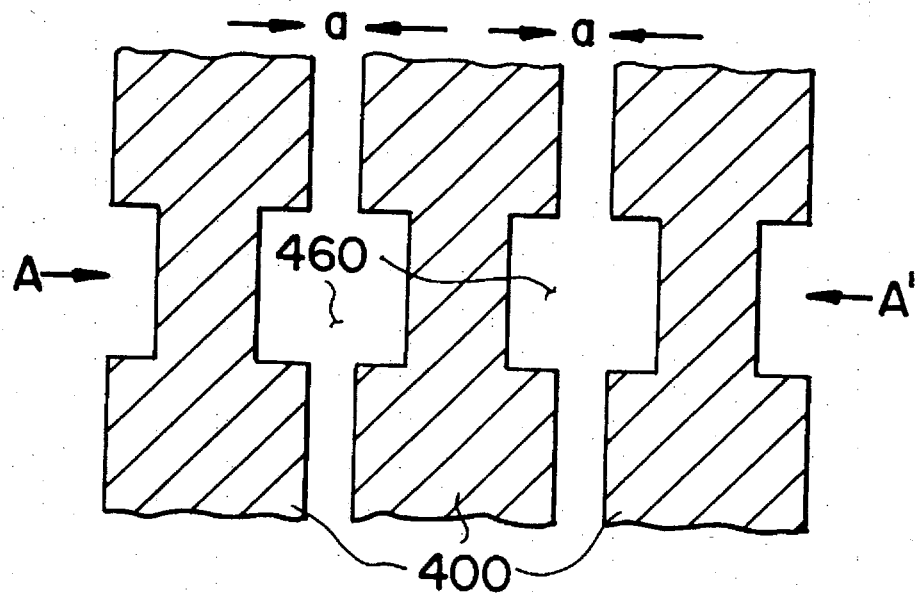
FIGS. 4A & 4B, FIGS. 5A, 5B & 5C and FIGS. 6A & 6B are layout diagrams and cross-sectional views for illustrating a highly integrated semiconductor device wiring structure according to the present invention.
Figure 4B:
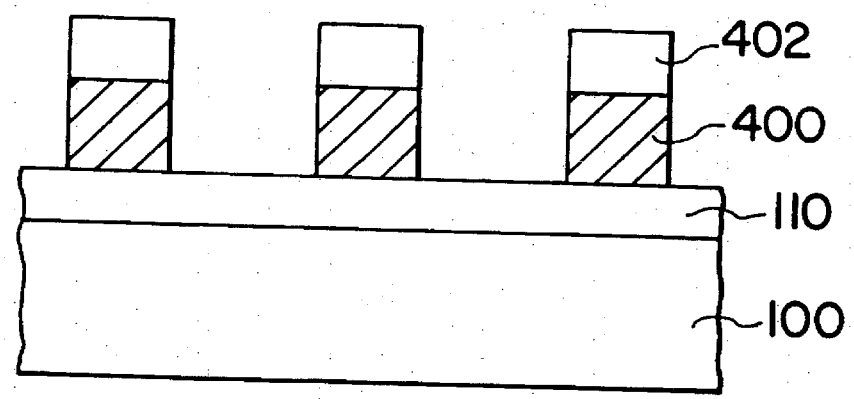

FIG. 4A is a layout diagram of a semiconductor device wiring structure wherein a plurality of wiring layers 400 are formed in generally parallel orientation, and FIG. 4B is a cross-sectional view taken along line AA' of FIG. 4A.

After forming a first insulating film 110 on a semiconductor substrate 100, as seen in FIG. 4B, a plurality of wiring layers 400, composed of conductive layers which are capped by insulating layers 402, are formed. Insulating layers 402 are not shown in FIG. 4A for clarity. The plurality of wiring layers 400 are formed so as to have a regular, generally parallel spacing and pattern with respect to one another, so that a region on which a contact hole is to be formed therebetween is widely formed with a first width between respective wiring layers and a remaining region therealong is more narrowly formed to a second width which is narrower than the first width. That is, the remaining spacing between respective wiring layers, away from the region for the contact hole, leaves distance "a" minimized.

Figure 5A:
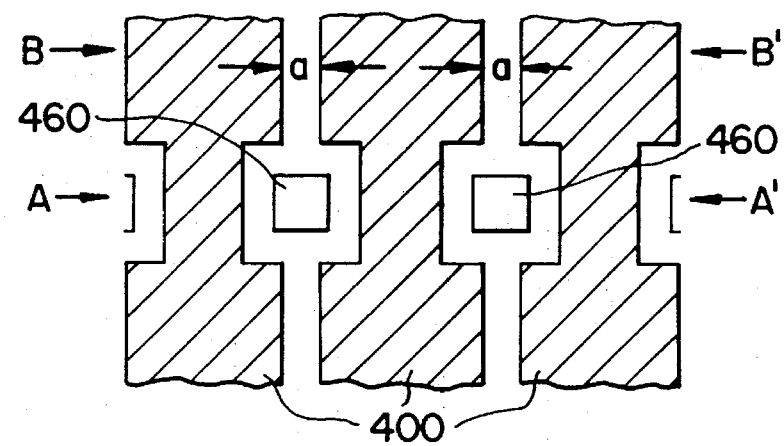
Figure 5B:
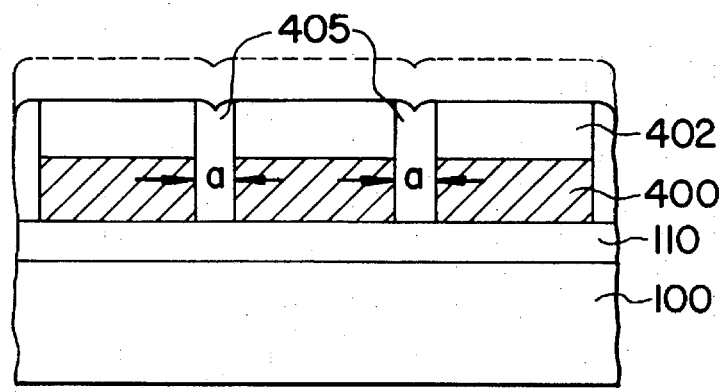
Figure 5C:
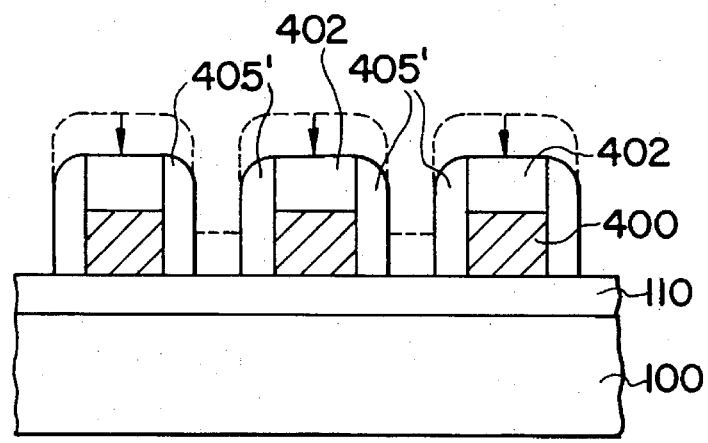

FIG. 5A is a layout diagram of a semiconductor wiring structure wherein a spacer 405' is formed about a region where a contact hole is subsequently formed between adjacent wiring layers, and FIGS. 5B and 5C are cross-sectional views taken along lines BB' and AA' in FIG. 5A, respectively.

After forming a second insulating film 405 which conformally covers the plurality of wiring layers 400, second insulating film 405 is then etched back. As a result, in a portion 460 between adjacent wiring layers 400, where a contact hole will be formed, a spacer 405' is formed on the opposing sidewalls of adjacent wiring layers 400 having the first width therebetween (refer to FIG. 5C). In the remaining, more narrow, portions, between the wiring layers, the spaces thus formed having the second width are filled with second insulating film 405 (refer to FIG. 5B). Second insulating film 405 must be formed to a thickness so as to fill the spaces formed between those portions of wiring layer 400 having the second width. Here, the preferred thickness of insulating film 405 is about half the distance "a" existing between those portions of wiring layers 400 having the second width therebetween.

Figure 6A:
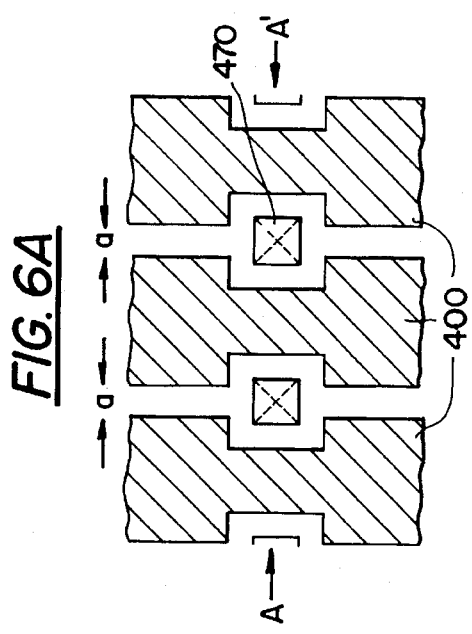
Figure 6B:
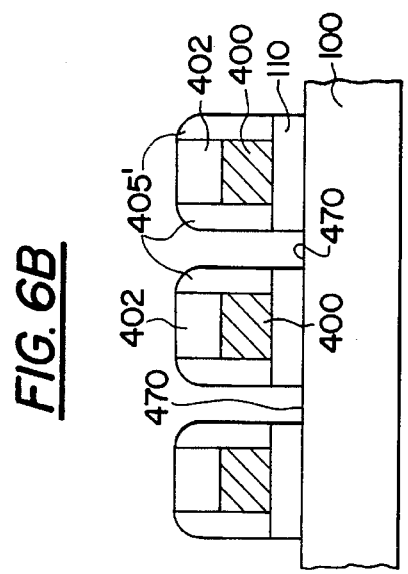

FIG. 6A is a layout diagram of a semiconductor device wiring structure at a manufacturing stage subsequent to that shown in FIG. 5A, wherein a contact hole 470 is formed, and FIG. 6B is a cross-sectional view taken along line AA' of FIG. 6A.

First insulating film 110 below wiring layer 400 is etched down to substrate 100 using insulating layer 402 and second insulating films 405 and 405' as an etch-mask, to thereby form contact holes 470 which are self-aligned with respect to wiring layers 400. Therefore, between neighboring wiring layers 400, contact holes 470 are formed in self-alignment with respect to wiring layers 400 without using a lithography process, with its lithography masks and the like.

An embodiment applying a semiconductor device wiring structure of the present invention to a DRAM cell will be explained in more detail with reference to the attached drawings.

Figure 7:
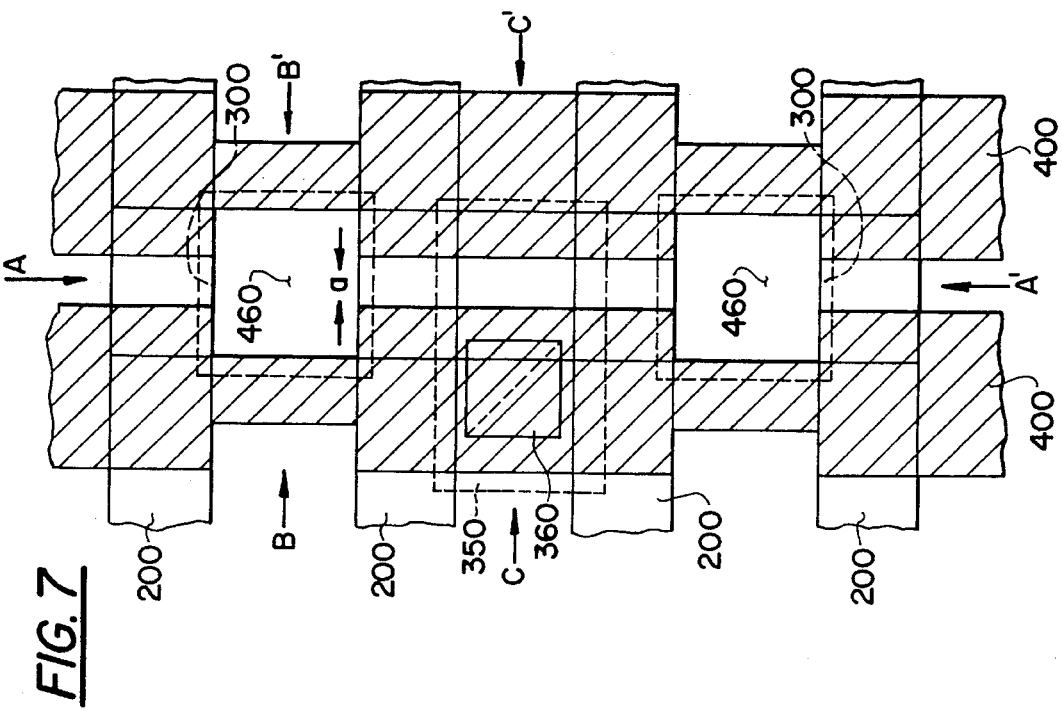
FIG. 7 is a layout diagram of a semiconductor memory device utilizing a wiring structure according to the present invention.

FIG. 7 is a layout diagram of a DRAM cell, using a wiring structure according to the present invention. Reference numeral 200 indicates a gate electrode, numerals 300 and 350 indicate first and second pad electrodes, numeral 360 indicates a bit-line contact hole, numeral 400 indicates a bit-line electrode, and numeral 470 indicates storage-node contact hole, respectively. As shown in FIG. 7, bit-line electrodes 400 of the present invention are formed such that wiring layer portions, which exclude the wiring layer portion adjacent to where a storage-node contact hole will be formed, protrude toward neighboring bit-line electrodes. Thus, the distance "a" between the neighboring bit-line electrodes is relatively minimized.

Figure 8A:
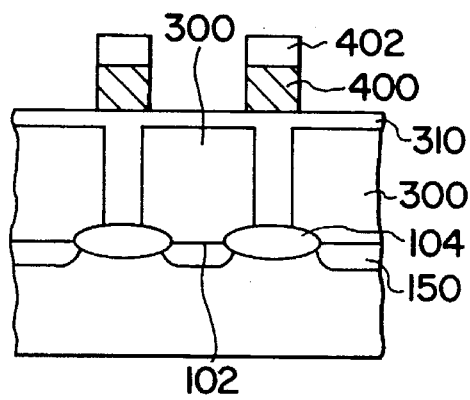
FIGS. 8A & 8B, 9A & 9B and 10 are cross-sectional views for illustrating a method of manufacturing a semiconductor memory device according to one embodiment of the present invention where
Figure 8B:
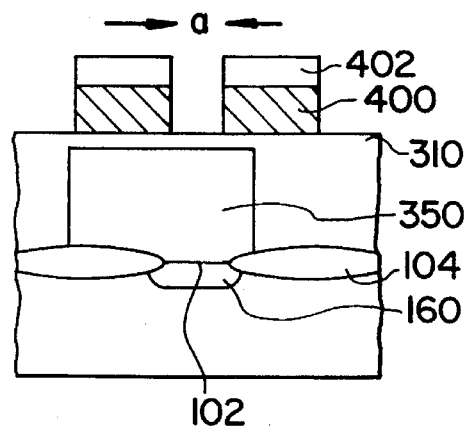
Figure 9A:
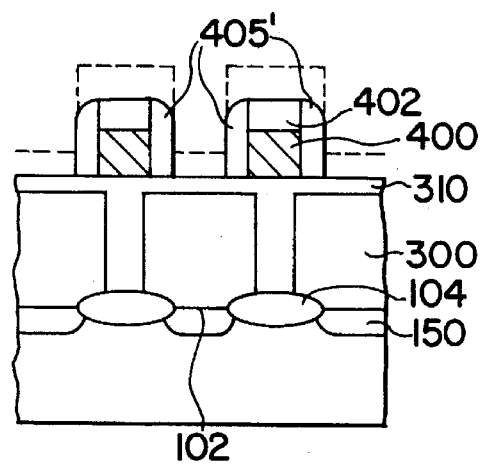
Figure 9B:
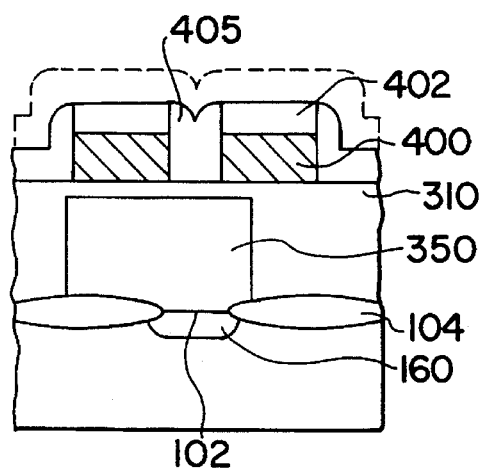
Figure 10:
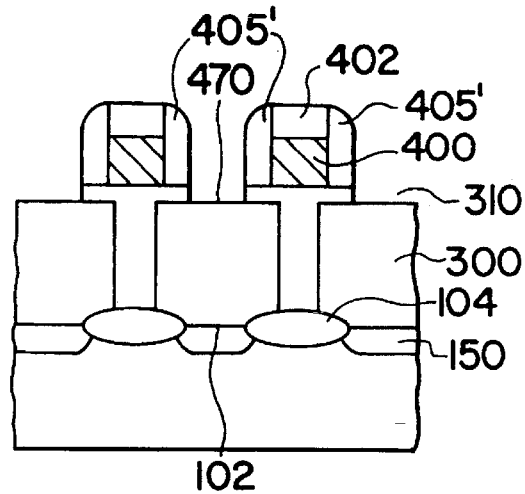

FIGS. 8A through 10 are cross-sectional views for illustrating a method for manufacturing a DRAM cell according to one embodiment of the present invention, wherein FIGS. 8A, 9A and FIGS. 8B, 9B are cross-sectional views taken along line BB' and CC' in FIG. 7, respectively. FIG. 10 is also a cross-sectional view taken along line BB' in FIG. 7.

FIGS. 8A and 8B show a step of forming first and second pad electrodes 300 and 350, a bit-line contact hole 360, and bit-line electrodes 400.

A device isolation region 104 is formed on a semiconductor substrate 100 of a first conductivity type, (e.g., P-type), thereby forming an active region 102. Then, after forming the gate oxide film 104 on substrate 100 by a thermal oxidation process, a conductive material, (e.g., an impurity-doped polycrystalline silicon), is deposited and patterned by a lithography process to obtain gate electrodes 200 (see FIG. 7). After depositing an insulating film, (e.g., an oxide), on the resultant structure on which gate electrodes 200 are formed, the insulating film is anisotropically etched to form a spacer (not shown) on the sidewalls of gate electrode 200. A contact hole (not shown) which exposes a portion of active region 102 is formed in a self-aligned manner with respect to gate electrode 200 during the abovementioned anisotropic etching process of the insulating film. Then, impurity ions are implanted throughout the entire surface of the resultant structure, including the contact hole, thereby forming first and second impurity regions 150 and 160 of the access transistor in substrate 100, which are spaced apart from one another by gate electrode 200. Thereafter, a conductive material (e.g., an impurity-doped polycrystalline silicon), is deposited on the resultant structure wherein first and second impurity regions 150 and 160 are formed, and is patterned by a lithography process, thereby forming first and second pad electrodes 300 and 350 which are connected with first and second impurity regions 150 and 160 of the access transistor, respectively. Then, an insulating material (e.g., a high temperature oxide or boro-phospho-silicate glass (BPSG)), is deposited to a thickness of 500–3000 Å on the resultant structure having first and second pad electrodes 300 and 350 formed thereon, thereby forming a first interlayer insulating film 310. Then, first interlayer insulating film 310 is selectively etched, to thereby form bit-line contact hole 360 on second pad electrode 350 which is connected with second impurity region 160. A conductive material (e.g., an impurity-doped polycrystalline silicon, or an impurity-doped polycrystalline silicon and a tungsten silicide (WSix) in stacked combination), is deposited to thicknesses of 500–1000 Å and 1000–2000 Å, respectively, on the resultant structure wherein bit-line contact hole 360 is formed, thereby forming a conductive layer 400. Then, an insulating material, (e.g., a silicon nitride ($Si_3N_4$)), is deposited to a thickness of 1500–3000 Å on the conductive layer 400, thereby forming a second interlayer insulating film 402. Thereafter, second interlayer insulating film 402 and the conductive layer 400 are patterned by a lithography process, thereby forming bit-line electrodes 400 capped by corresponding second interlayer insulating film portions 402. At this time, the distance "a" between bit-line electrodes 400, beyond a portion (reference numeral 460 in FIG. 7) where a storage-node contact hole is formed, is reduced. For example, according to a lithography process using a KrF excimer laser (248 nm), the above distance "a" is formed to a dimension of 0.2–0.25 µm.

FIGS. 9A and 9B show a step of forming a third interlayer insulating film 405. After forming third interlayer insulating film 405 by depositing an insulating material, (e.g., a silicon nitride), over bit-line electrodes 400, third interlayer insulating film 405 is then etched back, thereby filling the spaces which exist between bit-line electrodes 400 with third interlayer insulating film 405. For example, if the distance "a" between bit-line electrodes 400 is 0.2–0.25 µm, and if third interlayer insulating film 405 is formed to a thickness of 1,500–2,000 Å, the space between bit-line electrodes 400 can be filled thereby. At this time, in the portion 460 where a storage-node contact hole is to be formed, third interlayer insulating film 405 remains substantially only on the sidewalls of bit-line electrode 400 so as to form spacer 405'.

FIG. 10 shows a step of forming a storage-node contact hole 470. First interlayer insulating film 310 is etched back using second interlayer insulating film 402 and third interlayer insulating films 405 and 405' as an etch-mask, thereby forming storage-node contact hole 470 on first pad electrode 300 which is connected with first impurity region 150. Here, it is preferable to use a material for second interlayer insulating film 402 and third interlayer insulating films 405 and 405' which has a different etch rate from that of the material constituting first interlayer insulating film 310 with respect to any anisotropic etching process. If the etch rate of first interlayer insulating film 310 were similar to that of the second interlayer insulating film 402 and third interlayer insulating films 405 and 405', then second insulating film 402 and third insulating films 405 and 405' would be undesirably over-etched when first interlayer insulating film 310 is etched. Therefore, in order to avoid such a problem, the thickness of second interlayer insulating film 402 should be sufficiently thick.

Thereafter, though not shown, a storage node, a dielectric film and a plate node are sequentially formed on the resultant structure including storage-node contact hole 470 to thereby complete a cell capacitor.

According to the above-described embodiment of the present invention, the storage-node contact hole, which is self-aligned with respect to the bit-line electrode, is formed without using a lithography process. Therefore, an electrical short, which may occur between the storage node and bit-line electrode due to misalignment, is advantageously prevented.

Figure 11:
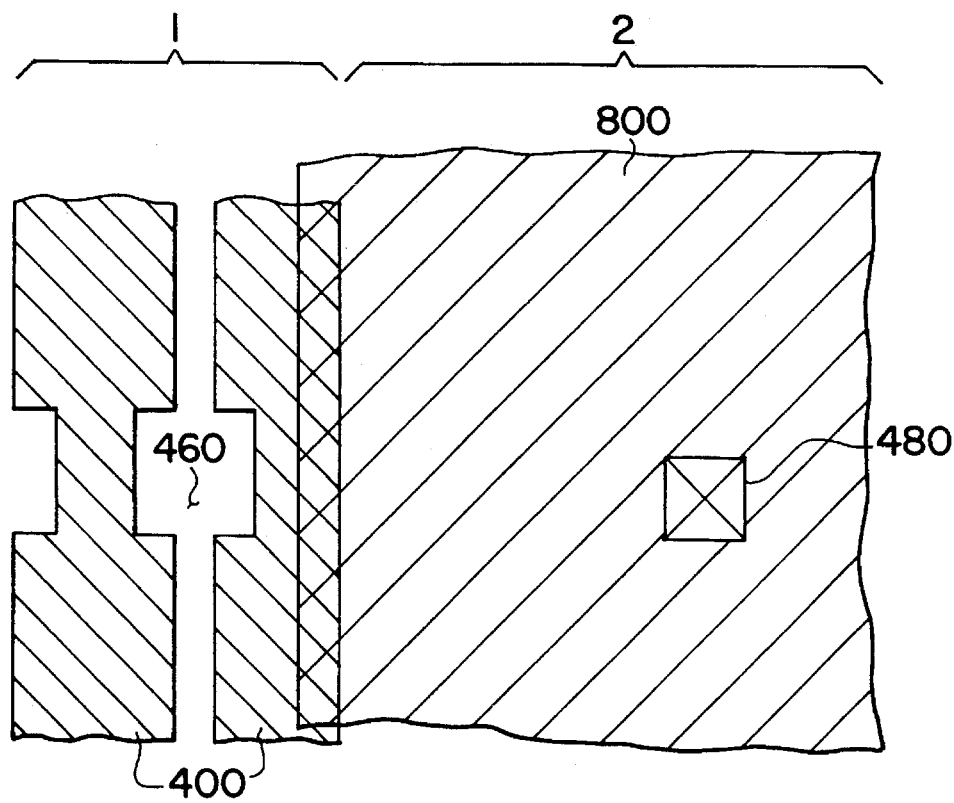
FIG. 11 is a layout diagram for illustrating a semiconductor device wiring structure according to another embodiment of the present invention.

FIG. 11 is a layout diagram for illustrating a semiconductor wiring structure according to another embodiment of the present invention.

Reference numeral 1 denotes a region wherein a plurality of wiring layers 400 come close to each other along one direction, and where a contact hole 470 is formed between wiring layers 400, such as in the cell array of a semiconductor memory device. Here, the contact hole is formed by the method described above in the first embodiment.

Reference numeral 2 denotes a loose design-rule region in which a contact hole 480 is formed, such as in a peripheral circuit region. In this case, after forming wiring layers 400, a third interlayer insulating film (like reference numeral 405 in FIGS. 9A and 9B, but not shown here) is formed on the entire surface of the resultant structure, as described with respect to FIGS. 9A and 9B. Thereafter, in region 2, a photoresist 800 is formed, excluding a portion 480 where a contact hole will be formed by a conventional method of contact hole formation using a lithography process. At this time, no portion of the photoresist 800 remains in region 1. Third interlayer insulating film 405 (now shown) is etched using photoresist 800 as an etch-mask. As a result, a contact hole 480 is formed in region 2 by the lithography process. In region 1, a contact hole surrounded by a spacer (reference numeral 405' in FIG. 10) is formed in a region 470 where the contact hole will be formed, and a remaining portion between respective wiring layers 400 is filled with third interlayer insulating film 405.

According to the above-described second embodiment of the present invention, in cases where the formation of a contact hole is needed in a region wherein adjacent wiring layers are not closely formed, the contact hole can be easily formed in that region by a lithography process while also using the method of the above first embodiment to form contact holes in regions where wiring layers are closely formed.

According to the present invention as described above, in a region wherein a plurality of wiring layers are repeatedly formed and a contact hole is formed between the wiring layers, such as in a cell array of a semiconductor memory device, the wiring layers are formed so that a portion of respective wiring layers adjacent where a contact hole will be formed are narrowly spaced, each wiring layer having a first wiring width adjacent the contact hole, and a remaining portion more widely spaced than the first width. Since a contact hole is formed in self-alignment fashion with respect to the respective wiring layers, a short, which may occur due to misalignment, is prevented, and the unit memory cell area can be reduced. Therefore, a reliable, highly integrated semiconductor memory device can be obtained. Also, lithography is not used during the formation of the contact hole, and thus, the process is very economical.

It will be understood by those skilled in the art that the foregoing description is a preferred embodiment of the disclosed device and that various changes and modifications may be made in the invention without departing from the spirit and scope thereof as defined by the appended claims.

What is claimed is:

1. A highly integrated semiconductor wiring structure comprising:

a plurality of wiring layers and a self-aligned contact hole formed therebetween;

said self-aligned contact hole being formed between and spaced from respective and adjacent ones of said plurality of wiring layers having a respective first wiring width thereat; and a remaining portion of each of said plurality of wiring layers having a second wiring width wider than said first wiring width in portions of said plurality of wiring layers other than where said self-aligned contact hole is formed.

2. A highly integrated semiconductor wiring structure comprising:

a semiconductor substrate having an impurity doped region;

a pad electrode material layer on said impurity doped region of said semiconductor substrate;

a first insulating material layer on said pad electrode material layer; and a first wiring layer parallel to a second wiring layer on said first insulating material layer, a first length of said first wiring layer adjacent to a first length of said second wiring layer each having a first wiring width, and a second length of said first wiring layer adjacent to a second length of said second wiring layer each having a second wiring width wider than said first wiring width, said first length of said first wiring layer being adjacent to said second length of said first wiring layer, and said first length of said second wiring layer being adjacent to said second length of said second wiring layer;

a conductive material layer on said first wiring layer and second wiring layer, said conductive material layer contacting said pad electrode material layer through a self-aligned contact hole formed by said first insulating material layer in a portion between only said first length of said first wiring layer and said first length of said second wiring layer.

3. A highly integrated semiconductor wiring structure according to claim 2, further comprising:

a second insulating material layer between said conductive layer and said first and second wiring layers.

4. A highly integrated semiconductor wiring structure according to claim 3, further comprising:

a third insulating material layer filling a spacing formed between said second length of said first wiring layer and said second length of said second wiring layer, said third insulating material layer covering opposing sidewalls of said first length of said first wiring layer and said first length of said second wiring layer.

5. A highly integrated semiconductor wiring structure according to claim 4, wherein:

said first insulating material layer has a first etch rate greater than a second etch rate of said second insulating material layer.

6. A highly integrated semiconductor wiring structure according to claim 4, wherein:

said first insulating material layer has a first etch rate greater than a second etch rate of said third insulating material layer.

7. A highly integrated semiconductor wiring structure according to claim 5, wherein:

said first etch rate of said first insulating material layer is greater than a third etch rate of said third insulating material layer.

\* \* \* \* \*